United States Patent
Hsu et al.

(10) Patent No.: US 7,944,308 B2
(45) Date of Patent: May 17, 2011

(54) AMPLIFIER CIRCUIT AND THE CONTROLLING METHOD THEREOF

(75) Inventors: Yu Cheng Hsu, Jhudong Township, Hsinchu County (TW); De Cheng Chang, Kaohsiung (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 0 days.

(21) Appl. No.: 12/481,528

(22) Filed: Jun. 9, 2009

(65) Prior Publication Data

US 2010/0244963 A1    Sep. 30, 2010

(30) Foreign Application Priority Data

Mar. 27, 2009   (TW) .............................. 98110062 A (51) Int. Cl.
    *H03F 3/68* (2006.01)
(52) U.S. Cl. ....................... 330/295; 330/264
(58) Field of Classification Search .............. 330/295, 330/124 R, 277, 311, 262–264
    See application file for complete search history.

(56) References Cited

U.S. PATENT DOCUMENTS

| 6,636,115 B2 | 10/2003 | Kim et al. |
| 7,265,593 B2 * | 9/2007 | Sung ........................... 327/112 |
| 7,586,375 B2 * | 9/2009 | Kim et al. ................... 330/295 |
| 2006/0049876 A1 | 3/2006 | Kim et al. |

OTHER PUBLICATIONS

Jongchan Kang, Jehyung Yoon, Kyoungjoon Min, Daekyu Yu, Joongjin Nam, Youngoo Yang, *Member, IEEE*, and Bumman Kim, *Senior Member, IEEE*, "A Highly Linear and Efficient Differential CMOS Power Amplifier with Harmonic Control," IEEE Journal of Solid-State Circuits, vol. 41, No. 6, Jun. 2006, pp. 1314-1322.

* cited by examiner

*Primary Examiner* — Hieu P Nguyen
(74) *Attorney, Agent, or Firm* — Egbert Law Offices PLLC (57) ABSTRACT

An amplifier circuit includes a first unit and a second unit. The first unit has a first amplifying unit, wherein the first amplifying unit provides a first main circuit unit and a first assistant circuit unit, and the first assistant circuit unit is configured for assisting the linearity of the first main circuit unit. The second unit includes a second amplifying unit, wherein the second amplifying unit has a second main circuit unit and a second assistant circuit unit, and the second assistant circuit unit is configured for assisting the linearity of the second main circuit unit. The first amplifying unit is configured for conducting in one half cycle of an input signal, and the second amplifying unit is configured for conducting in the other half cycle of the input signal.

16 Claims, 8 Drawing Sheets

AMPLIFIER CIRCUIT AND THE CONTROLLING METHOD THEREOF

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present disclosure relates to an amplifier circuit and a controlling method thereof.

2. Description of Related Art Including Information Disclosed Under 37 CFR 1.97 and 37 CFR 1.98

With the development of the wireless communication system developing from the second generation (2G) wireless network, to the third generation (3G) wireless network, to the new fourth generation (4G) wireless network, a big challenge that portable system designers encounter is to design a system supporting numerous wireless communication standards including the global system for mobile communications (GPRS), general packet radio service (GPRS), enhanced data rates for global evolution (EDGE), code division multiple access (CDMA), wideband CDMA (WCDMA) and wireless fidelity (Wi-Fi), such as IEEE 802.11 and the related standards. Also, the communication systems using a 4G topology require capability to operate in multiple frequencies and multiple modes and support of a multiple-input multiple-output (MIMO) antenna structure. However, the power source of most portable systems is a battery. Therefore, with the trend toward design of more complicated circuits and increasing number of devices, integrating modules in a system to a single chip and increasing battery lifetime are becoming important issues in portable system design.

In a portable wireless communication system, a baseband processor and a radio frequency receiver can now be integrated into a single chip. However, a radio frequency (RF) power amplifier (PA), which consumes the most power in the chip, is implemented by gallium-arsenide (GaAs) technology, and thus it cannot be integrated in the single chip. The known semi-insulative property of the GaAs material can largely reduce parasitic resistance in the base, making the GaAs material well-suited for the application of high frequency circuits. However, GaAs technology exhibits relatively low yields and high costs in manufacturing. In addition, such technology cannot implement a system-on-chip structure. Therefore, with the recent improvement of the CMOS technology, more and more chip designers are attempting to design RF power amplifiers by the CMOS technology.

The considerations in the design of an RF power amplifier in general are the linearity and the power efficiency. In general, the power efficiency is maximum when the RF power amplifier operates in or near the saturation region. However, in order to modulate an RF signal having an inconsistent envelope, the RF power amplifier usually operates at several dB of back-off out power from 1 dB gain compression point or peak power so as to insure it works at the linear region. The RF power amplifier operated in the linear region has lower power efficiency, and thus suffers from reduced battery life of the portable system.

Figure 1:
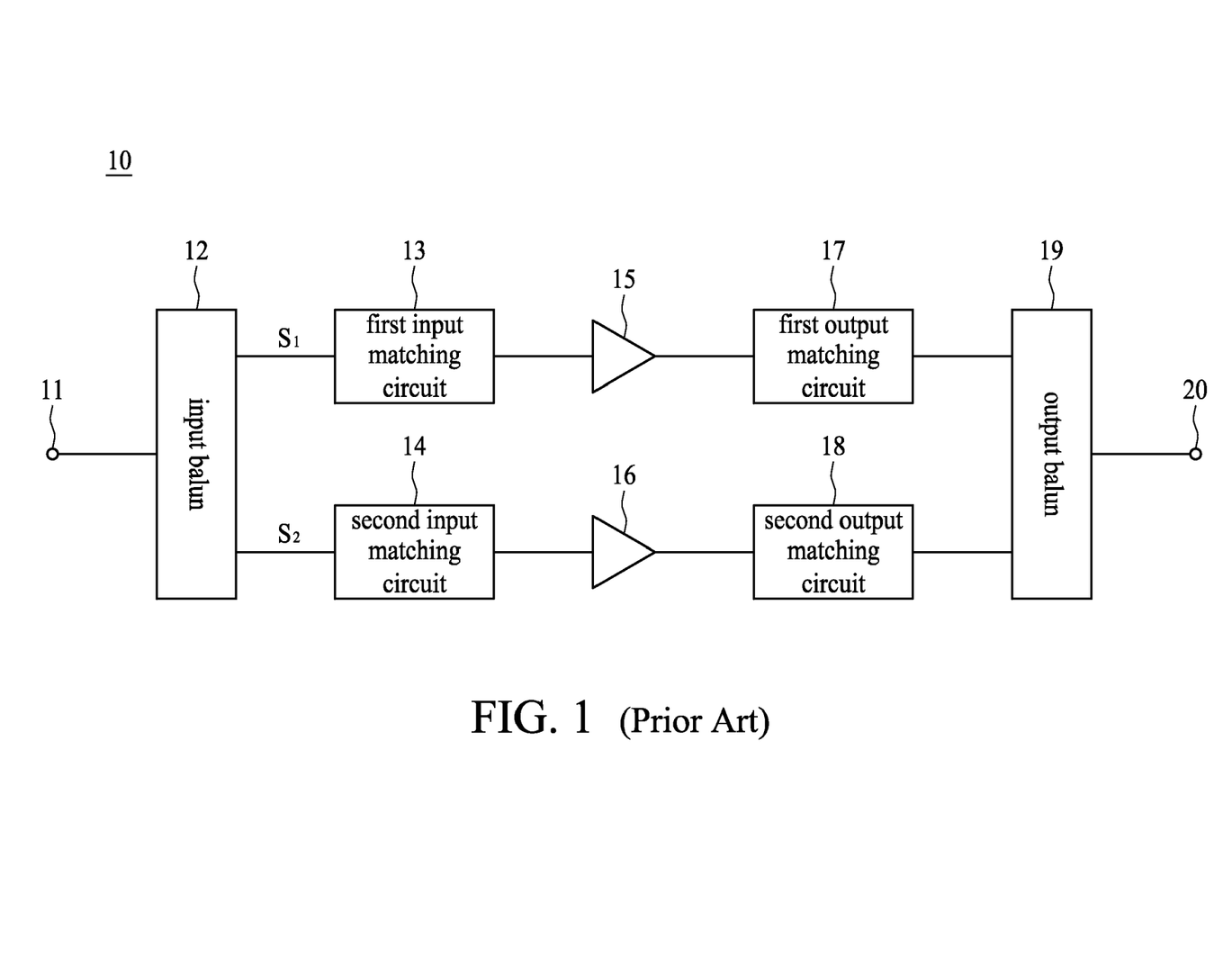
FIG. 1 shows a block diagram of a conventional RF power amplifier configured to suppress the second-order harmonic.

The factors causing the non-linearity of the power amplifier in general are the even-order harmonic and odd-order harmonic, wherein the even-order harmonic includes a second-order harmonic, which is usually the primary portion of the total harmonic distortion. FIG. 1 shows a block diagram of a conventional RF power amplifier 10 configured to suppress the second-order harmonic. Referring to FIG. 1, an input signal from an input terminal 11 is split through an input balun 12 into two signals S1 and S2, each having equal power and phase difference of 180 degrees with respect to each other. Signals S1 and S2 are transmitted to first and second input matching circuits 13 and 14, respectively, to obtain impedance matching, and then transmitted to first and second amplifiers 15 and 16, respectively. Next, the output signals of the first and second amplifiers 15 and 16 are transmitted to first and second output matching circuits 17 and 18, respectively, to obtain impedance matching, and transmitted to an output balun 19. The split signals S1 and S2 are combined in phase via the output balun 19 and the combined signal is outputted from an output terminal 20. Referring to FIG. 1, the conventional RF power amplifier 10 requires two baluns 12 and 19 to split and combine a signal.

Figure 2:
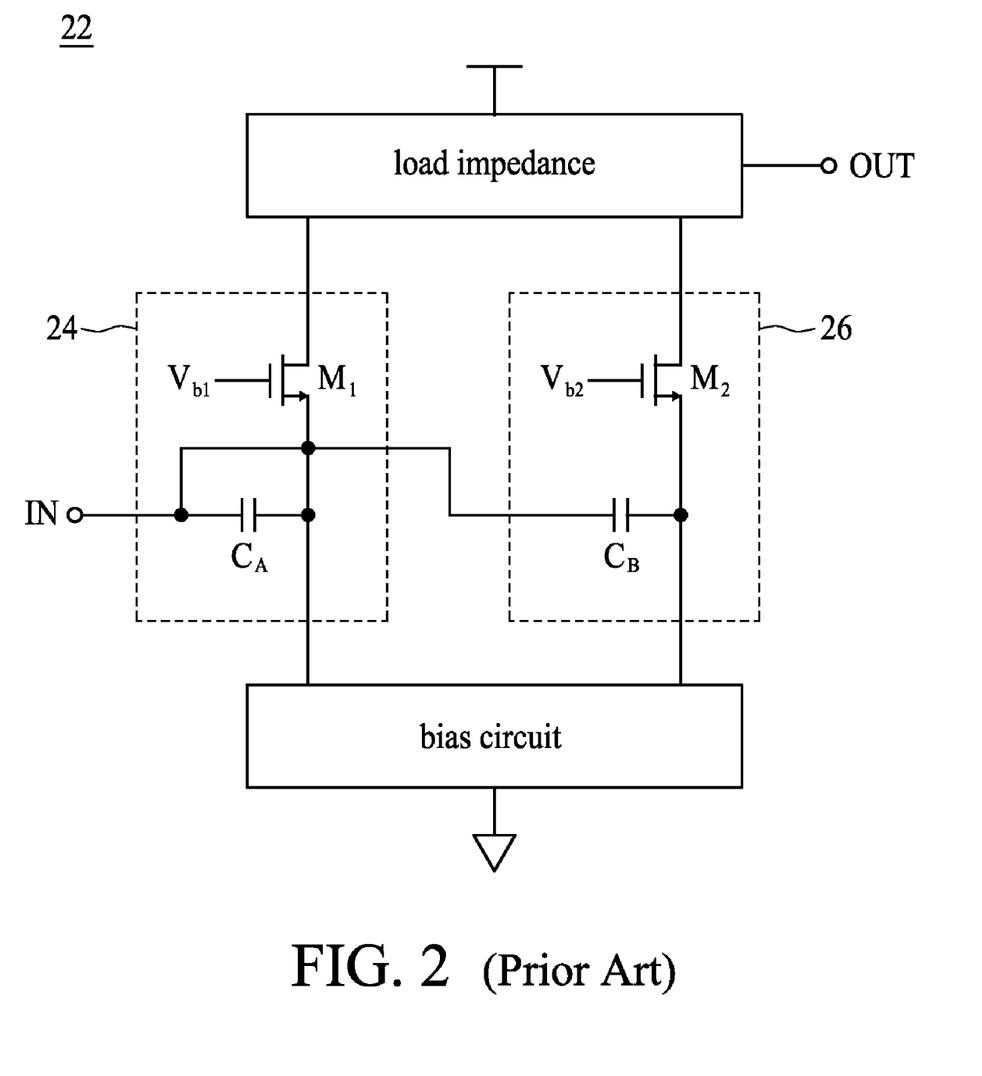
FIG. 2 shows a schematic view of an active circuit having improved linearity using multiple gated transistors.

US publication No. 2006/0049876 discloses an active circuit 22 having improved linearity using multiple gated transistors, wherein the active circuit 22 is a common gate circuit. Referring to FIG. 2, the active circuit 22 comprises a main circuit 24 and an assistant circuit 26. The main circuit 24 comprises a transistor $M_1$ and a capacitor $C_A$, and the assistant circuit 26 comprises a transistor $M_2$ and a capacitor $C_B$. The third-order harmonic of the active circuit 22 is suppressed via the assistant circuit 26; however, the second-order harmonic of the active circuit 22 requires an additional balun to be suppressed.

A conventional balun occupies a large chip area, and the power consumption of the balun reduces the overall efficiency of the chip. Therefore, it is desirable to provide an amplifier circuit having improved linearity and to provide a design for improving the power efficiency of the amplifying circuit and for increasing the battery life.

BRIEF SUMMARY OF THE INVENTION

According to one embodiment, providing an amplifier circuit comprises a first unit and a second unit. The first unit comprises a first amplifying unit, wherein the first amplifying unit comprises a first main circuit unit and a first assistant circuit unit, and the first assistant circuit unit is configured for assisting the linearity of the first main circuit unit. The second unit comprises a second amplifying unit, wherein the second amplifying unit comprises a second main circuit unit and a second assistant circuit unit, and the second assistant circuit unit is configured for assisting the linearity of the second main circuit unit. The first amplifying unit is configured for conducting in one half cycle of an input signal, and the second amplifying unit is configured for conducting in the other half cycle of the input signal.

According to one embodiment, providing a method for improving the linearity of an amplifier circuit comprises the steps of: receiving an input signal; conducting a first amplifying unit in one half cycle of the input signal and cutting off a second amplifying unit; cutting off the first amplifying unit in the other half cycle of the input signal and conducting the second amplifying unit; receiving a first control signal for adjusting the linearity of the first amplifying unit when the first amplifying unit conducts; and receiving a second control signal for adjusting the linearity of the second amplifying unit when the second amplifying unit conducts.

DETAILED DESCRIPTION OF THE INVENTION

Exemplary Embodiments will now be described more fully with reference to the accompanying drawings. The embodiments may, however, be embodied in many different forms and should not be construed as limited to the embodiments set forth herein. Rather, these embodiments are provided so that this disclosure will be thorough and complete, and will fully convey the scope of the embodiments to those skilled in the art.

Figure 3:
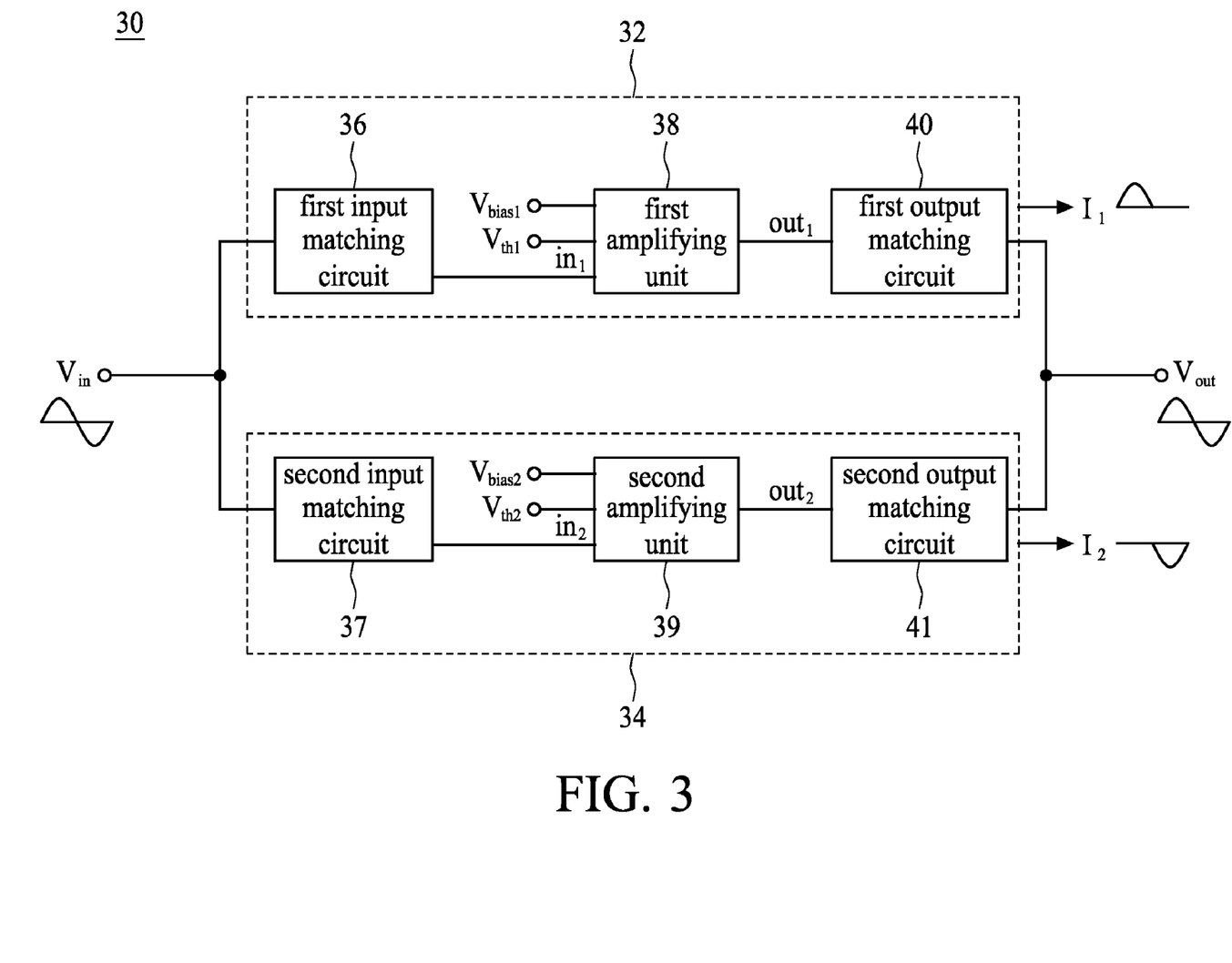
FIG. 3 shows a block diagram of an amplifier circuit according to one embodiment.

FIG. 3 shows a block diagram of an amplifier circuit 30 according to one embodiment. The amplifier circuit 30 comprises a first unit 32 and a second unit 34. The first unit 32 is configured to conduct in one half cycle of an input signal, and the second unit 34 is configured to conduct in the other half cycle of the input signal. Referring to FIG. 3, the first unit 32 comprises a first input matching circuit 36, a first amplifying unit 38, and a first output matching circuit 40, and the second unit 34 comprises a second input matching circuit 37, a second amplifying unit 39, and a second output matching circuit 41. In one embodiment, the first and second amplifying units 38 and 39 are push-pull architectures.

Referring to FIG. 3, the first and second input matching circuits 36 and 37 are disposed between an input terminal and the first and second amplifying units 38 and 39, and thus the input impedances of the first and second amplifying units 38 and 39 can match impedance with the input terminal and avoid an input signal Vin being reflected to the point of origin, resulting in the loss of the input power. The first and second output matching circuits 40 and 41 are disposed between an output terminal and the first and second amplifying units 38 and 39, and thus the output impedances of the first and second amplifying units 38 and 39 can match impedance with the system load impedance of the output terminal. And the matching circuits 40 and 41 are provided with phase tuning function in order to coherence the output signal from amplifying units 38 and 39. In one embodiment, the matching circuits 36, 37, 40, and 41 comprise at least one lump device. In another embodiment, the matching circuits 36, 37, 40, and 41 comprise at least one transmission line, or comprise at least one balanced to unbalanced transformer.

Figure 4:
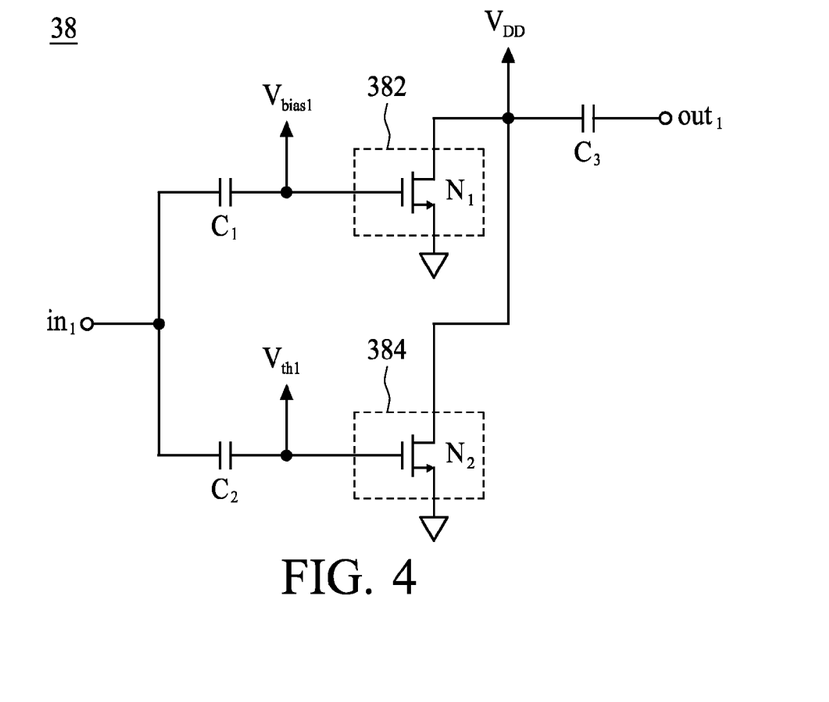
FIG. 4 shows a block diagram of the first amplifying unit according to one embodiment.

FIG. 4 shows a block diagram of the first amplifying unit 38 according to one embodiment. The first amplifying unit 38 comprises AC coupling capacitors $C_1$, $C_2$, and $C_3$, a main circuit unit 382, and an assistant circuit unit 384. Referring to FIG. 4, an input signal in1 is applied to the main circuit unit 382 and the assistant circuit unit 384 via the AC coupling capacitors $C_1$ and $C_2$, respectively. In one embodiment, the main circuit unit 382 is an NMOS transistor $N_1$. The drain terminal of the NMOS transistor $N_1$ is connected to a power source $V_{DD}$ and to an output terminal out1 via the AC coupling capacitors $C_3$. The source terminal of the NMOS transistor $N_1$ is connected to a reference voltage potential, and the gate terminal of the NMOS transistor $N_1$ is connected to a bias voltage $Vbias_1$.

As mentioned before, the first amplifying unit 38 conducts during the positive half-cycle of the input signal in1, while the second amplifying unit 39 cuts off. At this time, a current $I_1$ flowing to the output terminal of the amplifier circuit 30 can be expressed as $$I_1 = I_O \left\{ \frac{1}{2}\sin(wt) + \left[ \frac{1}{\pi} - \frac{2}{\pi} \sum_{n=2,4,\ldots}^{\infty} \frac{1}{n^2-1}\cos(nwt) \right] \right\}$$

wherein n represents the harmonic number of the combined current $I_O$.

In contrast, the first amplifying unit 38 cuts off during the negative half-cycle of the input signal in1, while the second amplifying unit 39 conducts. At this time, a current $I_2$ flowing to the output terminal of the amplifier circuit 30 can be expressed as $$I_2 = I_O \left\{ \frac{1}{2}\sin(wt) - \left[ \frac{1}{\pi} - \frac{2}{\pi} \sum_{n=2,4,\ldots}^{\infty} \frac{1}{n^2-1}\cos(nwt) \right] \right\}$$

The even-order harmonic of $I_O$ is suppressed after adding current $I_1$ and $I_2$. Therefore, the even-order harmonic of the amplifier circuit 30 can be suppressed via such architecture. The first and second amplifying units 38 and 39 do not turn on at the same time, and thus the direct power consumption of the chip can be reduced.

Referring to FIG. 4, the source terminal current of the NMOS transistor $N_1$ and the gate terminal to the source terminal voltage ($V_{gs}$) can be expressed as $$I_1 = I_O\left\{\frac{1}{2}\sin(wt) + \left[\frac{1}{\pi} - \frac{2}{\pi}\sum_{n=2,4,\ldots}^{\infty}\frac{1}{n^2-1}\cos(nwt)\right]\right\}$$

wherein gm represents a trans-conductance of the NMOS transistor $N_1$, and gm' and gm" are first and second derivatives of the trans-conductance, respectively.

Figure 6:
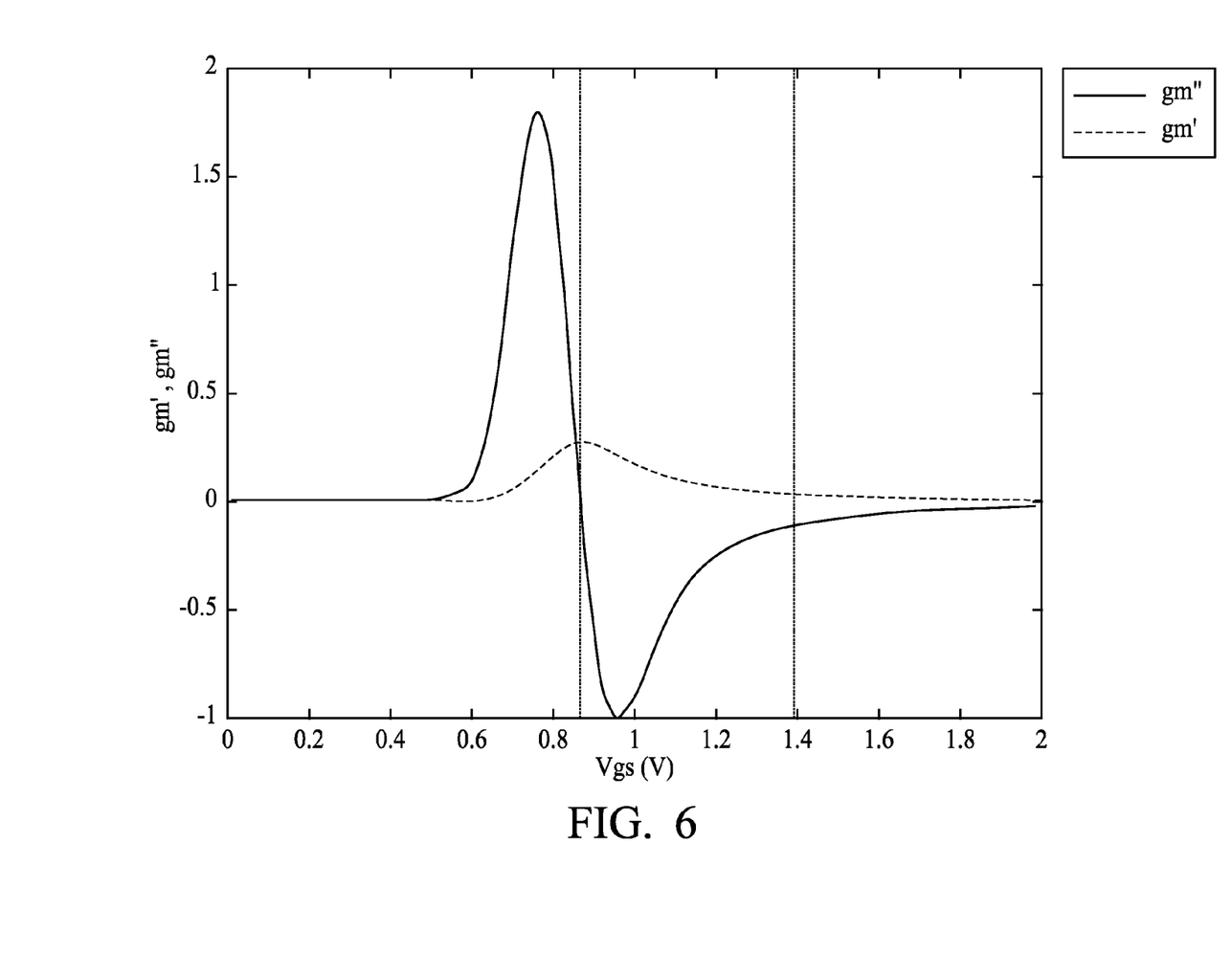
FIG. 6 shows a graph illustrating first and second order derivatives (gm' and gm") of the trans-conductance of the NMOS transistor $N_1$ with respect to voltage $V_{gs}$.

FIG. 6 shows a graph illustrating first and second order derivatives (gm' and gm") of the trans-conductance of the NMOS transistor $N_1$ with respect to voltage $V_{gs}$. Referring to FIG. 6, gm" has a positive value when $V_{gs}$ is less than a bias point of the class B amplifier (about 0.83V in the figure), and has a negative value when $V_{gs}$ is larger than the bias point of the class B amplifier. It is known in the art that gm" affects a 3rd Inter-Modulation Distortion (IMD3).

Accordingly, the assistant circuit unit 384 is configured to assist the linearity of the main circuit unit 382. In one embodiment, the assistant circuit unit 384 is an NMOS transistor $N_2$. The drain terminal of the NMOS transistor $N_2$ is connected to the power source $V_{DD}$ and to the output terminal out 1 via the AC coupling capacitors $C_3$. The source terminal of the NMOS transistor $N_2$ is connected to the reference voltage potential, and the gate terminal of the NMOS transistor $N_2$ is connected to a bias voltage $V_{th1}$. The bias voltage $V_{th1}$ is used to adjust the peak value of the second order derivative of the assistant circuit unit 384 so as to suppress the peak value of the second order derivative of the main circuit unit 382. In addition, the second order derivative of the assistant circuit unit 384 can be adjusted by varying the width to length ratio (W/L) of the NMOS transistor $N_2$.

Figure 7:
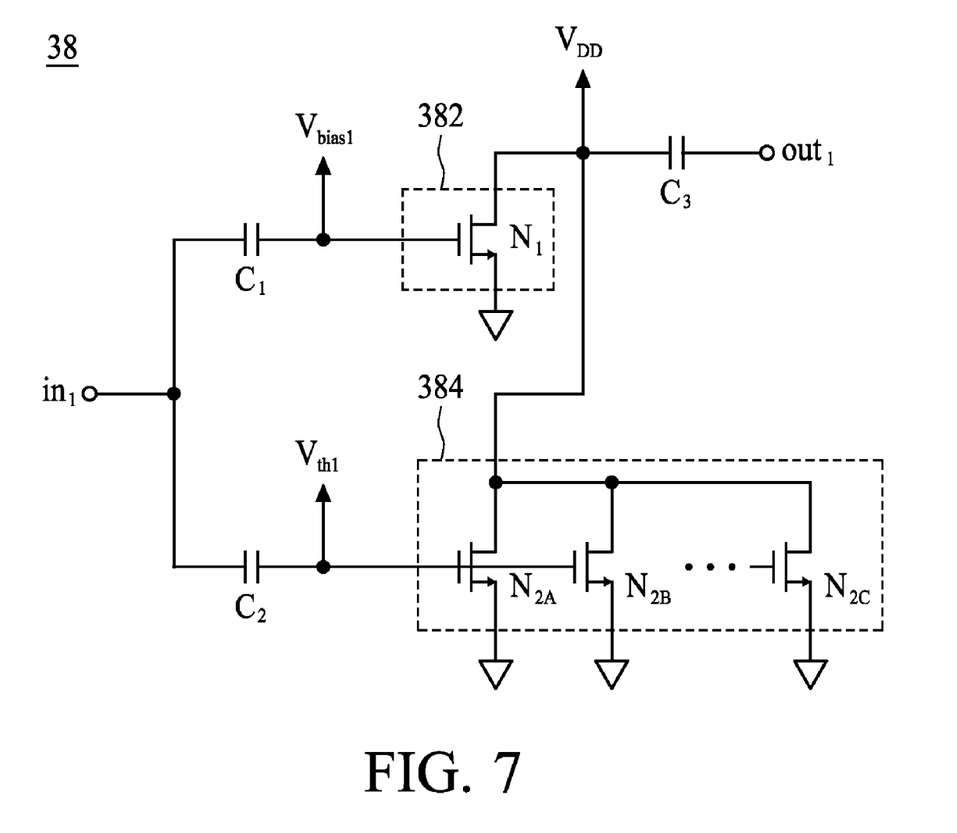
FIG. 7 shows a block diagram of the first amplifying unit according to another embodiment.

FIG. 7 shows a block diagram of the first amplifying unit 38 according to another embodiment. In this embodiment, the assistant circuit unit 384 comprises a plurality of NMOS transistors $N_{2A}$, $N_{2B}$, and $N_{2C}$ having the same width to length ratio (W/L) as the NMOS transistor $N_1$. The drain terminal of the NMOS transistors $N_{2A}$, $N_{2B}$, and $N_{2C}$ is connected to the power source $V_{DD}$. The source terminal of the NMOS transistors $N_{2A}$, $N_{2B}$, and $N_{2C}$ is connected to the reference voltage potential, and the gate terminal of the NMOS transistors $N_{2A}$, $N_{2B}$, and $N_{2C}$ is connected to the bias voltage $V_{th1}$. The linearity of the main circuit unit 382 can be adjusted by varying the number of parallel NMOS transistors $N_{2A}$, $N_{2B}$, and $N_{2C}$. In another embodiment, the width to length ratio (W/L) of the parallel NMOS transistors $N_{2A}$, $N_{2B}$, and $N_{2C}$ is not the same as the width to length ratio (W/L) of the NMOS transistor $N_1$. The linearity of the main circuit unit 382 can be adjusted by varying the bias voltage Vth1, or by varying the width to length ratio (W/L) of the parallel NMOS transistors $N_{2A}$, $N_{2B}$, and N.

Figure 5:
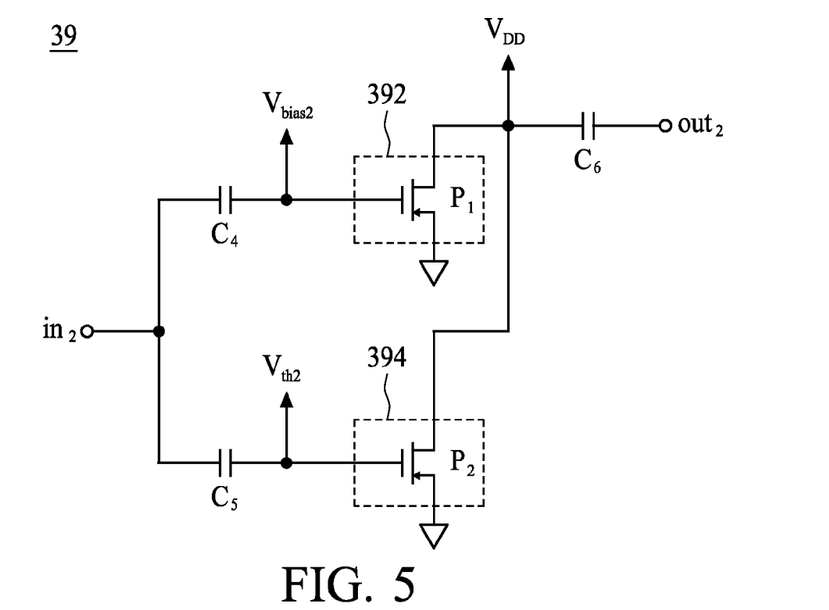
FIG. 5 shows a block diagram of the second amplifying unit according to one embodiment.

FIG. 5 shows a block diagram of the second amplifying unit 39 according to one embodiment. The second amplifying unit 39 comprises AC coupling capacitors $C_4$, $C_5$, and C6, a main circuit unit 392, and an assistant circuit unit 394. Referring to FIG. 5, an input signal in2 is applied to the main circuit unit 392 and the assistant circuit unit 394 via the AC coupling capacitors $C_4$ and $C_5$, respectively. In one embodiment, the main circuit unit 392 is a PMOS transistor $P_1$. The drain terminal of the PMOS transistor $P_1$ is connected to the power source $V_{DD}$ and to the output terminal $out_2$ via the AC coupling capacitors $C_6$. The source terminal of the PMOS transistor $P_1$ is connected to the reference voltage potential, and the gate terminal of the PMOS transistor $P_1$ is connected to a bias voltage Vbias$_2$.

Referring to FIG. 5, the assistant circuit unit 394 is configured to assist the linearity of the main circuit unit 392. In one embodiment, the assistant circuit unit 394 is a PMOS transistor $P_2$. The drain terminal of the PMOS transistor $P_2$ is connected to the power source $V_{DD}$ and to the output terminal out2 via the AC coupling capacitors $C_6$. The source terminal of the PMOS transistor $P_2$ is connected to the reference voltage potential, and the gate terminal of the PMOS transistor $P_2$ is connected to a bias voltage $V_{th2}$. The bias voltage $V_{th2}$ is used to adjust the peak value of the second order derivative of the assistant circuit unit 394 so as to suppress the peak value of the second order derivative of the main circuit unit 392. In addition, the second order derivative of the assistant circuit unit 394 can be adjusted by varying the width to length ratio (W/L) of the PMOS transistor $P_2$.

In another embodiment, the assistant circuit unit 394 comprises a plurality of PMOS transistors $P_{2A}$, $P_{2B}$, and $P_{2C}$ having the same width to length ratio (W/L) as the PMOS transistor $P_1$. The plurality of PMOS transistors $P_{2A}$, $P_{2B}$, and $P_{2C}$ are connected in parallel. The linearity of the main circuit unit 392 can be adjusted by varying the number of parallel PMOS transistors. In yet another embodiment, the width to length ratio (W/L) of the parallel PMOS transistors is not the same as the width to length ratio (W/L) of the PMOS transistor $P_1$. The linearity of the main circuit unit 392 can be adjusted by varying the bias voltage $V_{th2}$, or by varying the width to length ratio (W/L) of the parallel PMOS transistors.

Figure 8:
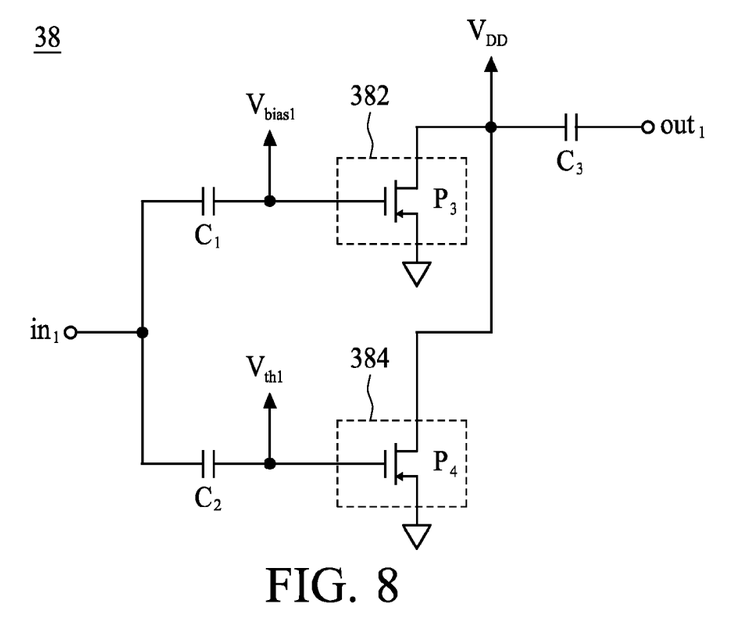
FIG. 8 shows a block diagram of the first amplifying unit according to yet another embodiment.

FIG. 8 shows a block diagram of the first amplifying unit 38 according to yet another embodiment. In this embodiment, the main circuit unit 382 is a PMOS transistor $P_3$. The drain terminal of the PMOS transistor $P_3$ is connected to the power source $V_{DD}$, the source terminal is connected to the reference voltage potential, and the gate terminal is connected to the bias voltage Vbias$_1$. The assistant circuit unit 384 is a PMOS transistor $P_4$. The drain terminal of the PMOS transistor $P_4$ is connected to the power source $V_{DD}$, the source terminal is connected to the reference voltage potential, and the gate terminal is connected to the bias voltage $V_{th1}$. The linearity of the main circuit unit 382 can be adjusted by varying the bias voltage $V_{th1}$, or varying the width to length ratio (W/L) of the PMOS transistor $P_4$.

In another embodiment, the assistant circuit unit 384 comprises a plurality of PMOS transistors having the same width to length ratio (W/L) as the PMOS transistor $P_3$. The plurality of PMOS transistors are connected in parallel. The linearity of the main circuit unit 382 can be adjusted by varying the number of parallel PMOS transistors.

Figure 9:
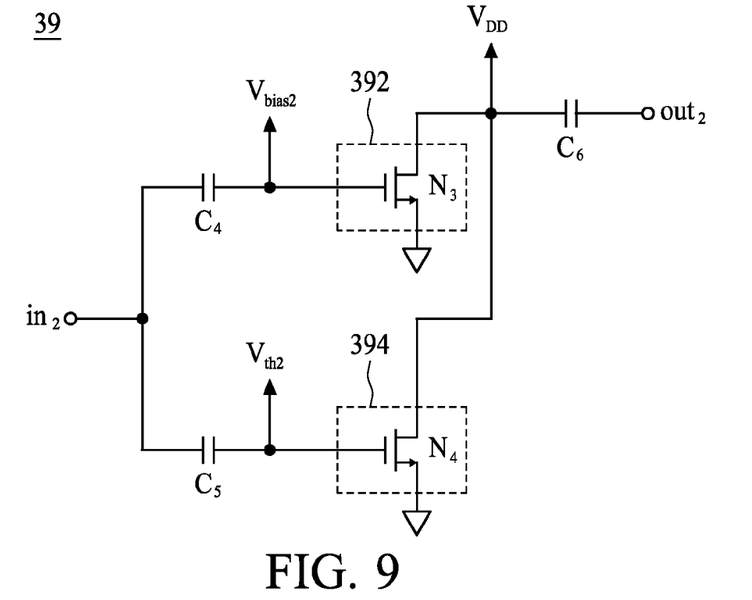
FIG. 9 shows a block diagram of the second amplifying unit according to yet another embodiment.

FIG. 9 shows a block diagram of the second amplifying unit 39 according to yet another embodiment. In this embodiment, the main circuit unit 392 is an NMOS transistor $N_3$. The drain terminal of the NMOS transistor $N_3$ is connected to the power source $V_{DD}$, the source terminal is connected to the reference voltage potential, and the gate terminal is connected to the bias voltage Vbias$_2$. Also, the assistant circuit unit 394 is an NMOS transistor $N_4$. The drain terminal of the NMOS transistor $N_4$ is connected to the power source $V_{DD}$, the source terminal is connected to the reference voltage potential, and the gate terminal is connected to the bias voltage $V_{th2}$. The linearity of the main circuit unit 392 can be adjusted by varying the bias voltage $V_{th2}$, or by varying the width to length ratio (W/L) of the NMOS transistor $N_4$.

In another embodiment, the assistant circuit unit 394 comprises a plurality of NMOS transistors having the same width to length ratio (W/L) as the NMOS transistor $N_3$. The plurality of NMOS transistors is connected in parallel. The linearity of the main circuit unit 392 can be adjusted by varying the number of parallel PMOS transistors.

The present disclosure also discloses an exemplary embodiment of method for improving the linearity of the amplifier circuit. In one embodiment, the method first receives an input signal. The first amplifying unit 38 conducts in one half cycle of an input signal, and the second amplifying unit 39 cuts off. The first amplifying unit 38 cuts off in the other half cycle of an input signal, and the second amplifying unit 39 conducts. Next, a first control signal is received to adjust the linearity of the first amplifying unit 38 when the first amplifying unit 38 conducts, and a second control signal is received to adjust the linearity of the second amplifying unit 39 when the second amplifying unit 39 conducts. In one embodiment, the first control signal is the bias voltage $V_{th1}$, and the second control signal is the bias voltage $V_{th2}$.

Figure 10A:
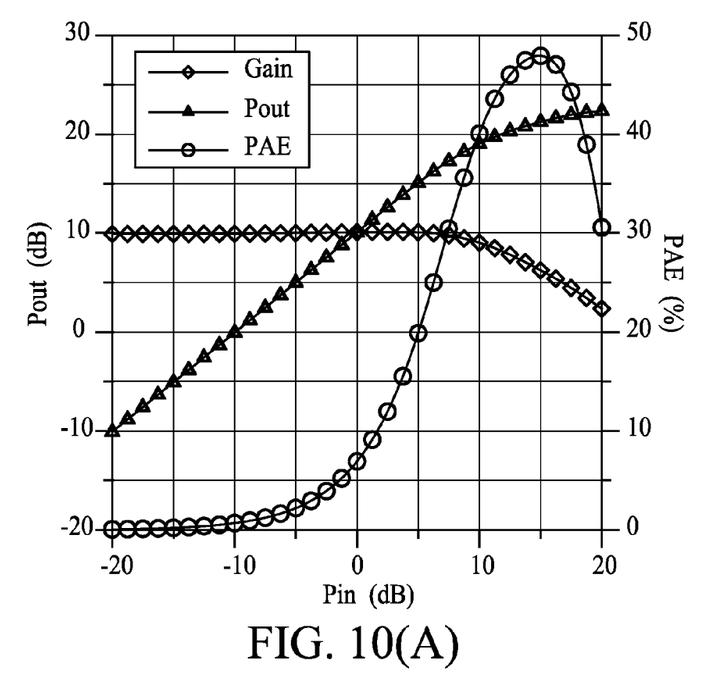
FIG. 10(A) shows a simulation result of the output power Pout, gain, power added efficiency (PAE) of the amplifier circuit according to yet another embodiment.
Figure 10B:
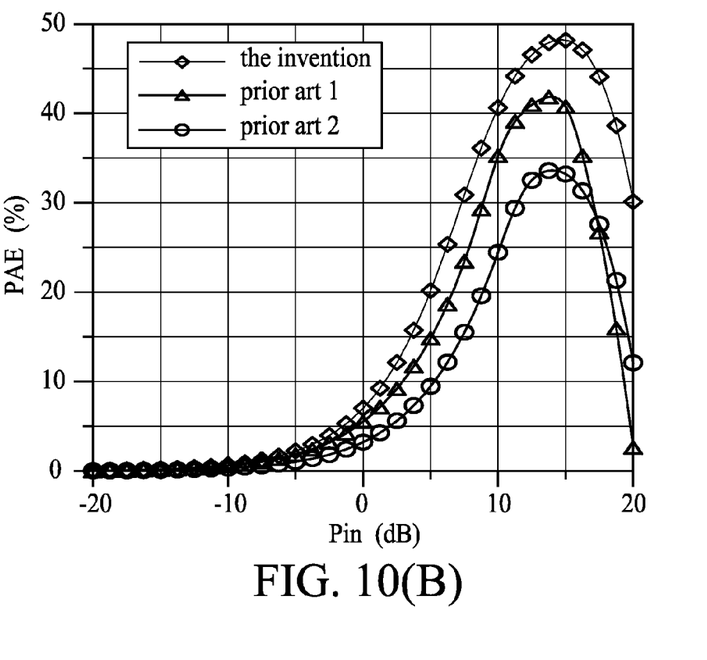
FIG. 10(B) shows a comparison result of the amplifier circuit with the prior art 1 and prior art 2 arrangements.

FIG. 10(A) shows a simulation result of the output power Pout, gain, power added efficiency (PAE) of the amplifier circuit 30 according to yet another embodiment. FIG. 10(B) shows a comparison result of the amplifier circuit 30 with the prior art 1 and prior art 2 arrangements. The prior art 1 arrangement is a combination of an architecture disclosed in US publication No. 2006/0049876 with an additional resonator circuit. The resonator circuit is used to suppress the second-order harmonic so as to achieve the same linearity as the amplifier circuit 30. The prior art arrangement 2 is a combination of an architecture disclosed in US publication No. 2006/0049876 with two additional input and output baluns. The baluns are used to suppress the second-order harmonic so as to achieve the same linearity as the amplifier circuit 30. Referring to FIG. 10(B), the PAE of the amplifying circuit of an embodiment can increase 10% to 20% compared to the prior art 1 and prior art 2 arrangements.

The above-described exemplary embodiments are intended to be illustrative only. Those skilled in the art may devise numerous alternative embodiments without departing from the scope of the following claims.

We claim:

1. An amplifier circuit comprising:
a first unit having a first amplifying unit, said first amplifying unit having a first main circuit unit and a first assistant circuit unit, said first assistant circuit unit being configured to assist a linearity of said first main circuit unit, said first main circuit unit having a first transistor, said first assistant circuit unit having at least one second transistor;
a second unit having a second amplifying unit, said second amplifying unit having a second main circuit unit and a second assistant circuit unit, said second main circuit unit being a third transistor, said second assistant circuit unit being at least one fourth transistor, said second assistant circuit unit being configured to assist a linearity of said second main circuit unit, the linearity of said first main circuit unit being adjusted by a width-to-length ratio of said at least one second transistor or being adjusted by a first bias voltage connected to said at least one second transistor, wherein said first amplifying unit is configured for conducting in one half cycle of an input signal, and wherein said second amplifying unit is configured for conducting in another half cycle of said input signal.

2. The amplifier circuit of claim 1, wherein said first transistor is an NMOS transistor, said at least one second transistor is an NMOS transistor, said third transistor is a PMOS transistor, and said at least one fourth transistor is a PMOS transistor.

3. The amplifier circuit of claim 1, wherein said first transistor has a drain terminal connected to a power source, said first transistor has a source terminal connected to a reference voltage potential, said first transistor has a gate terminal connected to a second bias voltage, said at least one second transistor has a drain terminal connected to the power source, said at least one second transistor has a source terminal connected to the reference voltage potential, said at least one second transistor has a gate terminal connected to the first bias voltage, said third transistor has a drain terminal connected to the power source, said third transistor has a source terminal connected to the reference voltage potential, said third transistor has a gate terminal connected to a third bias voltage, said at least one fourth transistor has a drain terminal connected to the power source, said at least one fourth transistor has a source terminal connected to the reference voltage potential, said at least one fourth transistor has a gate terminal connected to a fourth bias voltage.

4. The amplifier circuit of claim 1, wherein said the first transistor is a PMOS transistor, said at least one second transistor is a PMOS transistor, said third transistor is an NMOS transistor, and said at least one fourth transistor is an NMOS transistor.

5. The amplifier circuit of claim 1, wherein said first transistor has a drain terminal connected to the power source, said first transistor has a source terminal connected to a reference voltage potential, said first transistor has a gate terminal connected to a fifth bias voltage, said at least one second transistor has a drain terminal connected to the power source, said at least one second transistor has a source terminal connected to the reference voltage potential, said at least one second transistor has a gate terminal connected to the first bias voltage.

6. The amplifier circuit of claim 1, wherein said first transistor is connected to a first node via a first alternating current coupling capacitor, said first transistor is connected to a second node via a second alternating current coupling capacitor.

7. The amplifier circuit of claim 6, wherein said at least one second transistor is connected to said first node via a third alternating current coupling capacitor.

8. A push-pull amplifier circuit comprising:
a first unit having a first amplifying unit, said first amplifying unit having a first main circuit unit and a first assistant circuit unit, said first assistant circuit unit being configured to assist a linearity of said first main circuit unit, said first main circuit unit having a first transistor, said first assistant circuit unit having at least one second transistor;
a second unit having a second amplifying unit, said second amplifying unit having a second main circuit unit and a second assistant circuit unit, said second main circuit unit being a third transistor, said second assistant circuit unit being at least one fourth transistor, said second assistant circuit unit being configured to assist a linearity of said second main circuit unit, the linearity of the first main circuit being adjusted by a first bias voltage connected to said at least one second transistor, said first transistor having a drain terminal connected to a power source, said first transistor having a source terminal connected to a reference voltage potential, said first transistor having a gate terminal connected to a second bias voltage, said at least one second transistor having a drain terminal connected to the power source, said at least one second transistor having a source terminal connected to the reference voltage potential, said at least one second transistor having a gate terminal connected to said first bias voltage, said third transistor having a drain terminal connected to the power source, said third transistor having a source terminal connected to the reference voltage potential, said third transistor having a gate terminal connected to a third bias voltage, said at least one fourth transistor having a drain terminal connected to the power source, said at least one fourth transistor having a source terminal connected to the reference voltage potential, said at least one fourth transistor having a gate terminal connected to a fourth bias voltage, the linearity of said first main circuit unit being adjusted by said second bias voltage, the linearity of said second main circuit unit being adjusted by the fourth bias voltage.

9. The amplifier circuit of claim 8, wherein the linearity of the first main circuit unit is adjusted by a width-to-length ratio of said at least one second transistor.

10. The amplifier circuit of claim 8, wherein a width to length ratio of said at least one second transistor is the same as that of said first transistor, and the linearity of the first main circuit unit is adjusted by varying a number of the second transistors.

11. The amplifier circuit of claim 8, wherein the linearity of the second main circuit unit is adjusted by a width-to-length ratio of said at least one fourth transistor.

12. The amplifier circuit of claim 8, wherein a width to length ratio of said at least one fourth transistor is the same as that of said third transistor, and the linearity of the second main circuit unit is adjusted by varying a number of the fourth transistors.

13. The amplifier circuit of claim 8, wherein said first unit further has a first input matching circuit and a first output matching circuit.

14. The amplifier circuit of claim 8, wherein said second unit has a second input matching circuit and a second output matching circuit.

15. A method for improving a linearity of an amplifier circuit comprising:

receiving an input signal;

conducting a first amplifying unit in one half cycle of the input signal and cutting off a second amplifying unit, said first amplifying unit having a first main circuit unit and a first assistant circuit unit, said second amplifying unit having a second main circuit unit and a second assistant circuit unit, said first main circuit unit having a first transistor, said first assistant circuit unit having at least one second transistor, said second main circuit unit having a third transistor, and the second assistant circuit unit having at least one fourth transistor;

cutting off said first amplifying unit in another half cycle of the input signal and conducting said second amplifying unit;

receiving a first control signal for adjusting a linearity of said first amplifying unit when said first amplifying unit conducts; and receiving a second control signal for adjusting a linearity of said second amplifying unit when said second amplifying unit conducts, wherein the first control signal is used for adjusting a width-to-length ratio of said at least one second transistor, and the second control signal is used for adjusting a width to length ratio of said at least one fourth transistor, wherein a width-to-length ratio of said at least one second transistor is the same as that of said first transistor, and the first control signal is used for adjusting a number of the second transistors.

16. The method of claim 15, wherein a width-to-length ratio of said at least one fourth transistor is the same as that of said third transistor, and the second control signal is used for adjusting a number of the fourth transistors.

* * * * *